United States Patent
Oh

(10) Patent No.: US 10,262,742 B2
(45) Date of Patent: Apr. 16, 2019

(54) MEMORY PROTECTION CIRCUIT AND LIQUID CRYSTAL DISPLAY INCLUDING SAME

(71) Applicant: LG DISPLAY CO., LTD., Seoul (KR)

(72) Inventor: Yunmi Oh, Pyeongtaek-si (KR)

(73) Assignee: LG DISPLAY CO., LTD., Seoul (KR)

( * ) Notice: Subject to any disclaimer, the term of this patent is extended or adjusted under 35 U.S.C. 154(b) by 172 days.

(21) Appl. No.: 14/581,504

(22) Filed: Dec. 23, 2014

(65) Prior Publication Data

US 2015/0187427 A1  Jul. 2, 2015

(30) Foreign Application Priority Data

Dec. 31, 2013  (KR) .................. 10-2013-0168643

(51) Int. Cl.
```
G06F 3/038      (2013.01)
G09G 5/00       (2006.01)
G11C 16/22      (2006.01)
G09G 3/36       (2006.01)
G11C 16/10      (2006.01)
```
(52) U.S. Cl.
CPC ............ *G11C 16/22* (2013.01); *G09G 3/3611* (2013.01); *G09G 3/3696* (2013.01); *G11C 16/102* (2013.01)

(58) Field of Classification Search
None
See application file for complete search history.

(56) References Cited

U.S. PATENT DOCUMENTS

| | | | | |
|---|---|---|---|---|
| 4,635,165 A | * | 1/1987 | Okuaki | G11C 16/18 174/535 |
| 4,811,287 A | * | 3/1989 | Kupersmith | G11C 16/22 365/195 |
| 4,897,819 A | * | 1/1990 | Takizawa | G06F 11/004 365/189.16 |
| 5,274,827 A | * | 12/1993 | Haggerty | G06F 1/30 365/226 |
| 2002/0135605 A1 | * | 9/2002 | Kim | G09G 1/167 345/698 |

(Continued)

FOREIGN PATENT DOCUMENTS

CN       1331443 A        1/2002
CN     201117293 Y    *   9/2008
(Continued)

*Primary Examiner* — Abdul-Samad A Adediran
*Assistant Examiner* — Kirk W Hermann
(74) *Attorney, Agent, or Firm* — Dentons US LLP

(57) ABSTRACT

Provided is a liquid crystal display device, including: a liquid crystal display panel; a memory for storing driving information and image data modulation information, and supplying the stored driving information and image data modulation information to a timing controller; a memory protection circuit for enhancing a write protection function of the memory, the memory protection circuit including a pull-up resistor for pulling up a write protection terminal of the memory to a power voltage, and a pad connected to the write protecting terminal and applying a low voltage to the write protection terminal; and a timing controller for reading the data stored in the memory to output various control signals for driving the liquid crystal display panel.

5 Claims, 2 Drawing Sheets

(56) References Cited

U.S. PATENT DOCUMENTS

| | | | |
|---|---|---|---|
| 2004/0189573 A1* | 9/2004 | Lee | G09G 3/3648 345/94 |
| 2005/0237804 A1 | 10/2005 | Naso et al. | |
| 2006/0028419 A1* | 2/2006 | Lee | G09G 3/3648 345/98 |
| 2006/0049523 A1* | 3/2006 | Lin | H01L 23/49811 257/738 |
| 2007/0000971 A1 | 1/2007 | Kumagai et al. | |
| 2007/0126460 A1* | 6/2007 | Chung | G09G 3/3648 345/98 |
| 2010/0284223 A1* | 11/2010 | Kaneda | G11C 16/08 365/185.11 |
| 2011/0110173 A1* | 5/2011 | Chang | G11C 5/143 365/191 |
| 2011/0128215 A1* | 6/2011 | Chang | G09G 3/3648 345/98 |
| 2011/0205811 A1* | 8/2011 | Honda | H01L 27/115 365/189.03 |
| 2014/0285540 A1* | 9/2014 | Wu | G09G 3/36 345/691 |

FOREIGN PATENT DOCUMENTS

| | | | |
|---|---|---|---|
| CN | 102081915 A | | 6/2011 |
| CN | 102243890 A | | 11/2011 |
| JP | 2012174314 A | * | 9/2012 |

\* cited by examiner

MEMORY PROTECTION CIRCUIT AND LIQUID CRYSTAL DISPLAY INCLUDING SAME

This application claims the priority benefit of Korean Patent Application No. 10-2013-0168643 filed on Dec. 31, 2013, which is incorporated herein by reference for all purposes as if fully set forth herein.

BACKGROUND OF THE INVENTION

Field of the Invention

This invention relates to a memory protection circuit and a liquid crystal display device including the same.

Discussion of the Related Art

A liquid crystal display is one of the flat panel displays which are most widely used, and includes two substrates having pixel electrodes, a common electrode, and the like, and a liquid crystal layer interposed between the two substrates. The liquid crystal display displays an image by determining orientations of liquid crystal molecules of the liquid crystal layer through an electric field generated by a voltage applied to the electrodes, and controlling polarization of an incident light. The liquid crystal display is advantageous to display moving images and has a high contrast ratio. Thus, the liquid crystal display can be substituted for cathode ray tube displays, and has been variously used as a display device of mobile terminals (notebook monitor, etc.), computer monitors, televisions, and the like.

The liquid crystal display includes an electrically erasable programmable read only memory (EEPROM) which reads model information, such as resolution and timing, from a system even during a system booting process, to transmit the model information to a liquid crystal driving circuit unit. The EEPROM is a readable and writable memory. However, in the process of manufacturing a liquid crystal display, the write protection function of the EEPROM is enabled and thus the write function is disabled in a state of a liquid crystal module (LCM) that typically includes a liquid crystal panel, driving circuits, and a case. In other words, since the write protection function of the EEPROM is not enabled before the liquid crystal module is fabricated, EEPROM data may be often damaged and transformed by external electric shocks or the like.

SUMMARY OF THE INVENTION

The present invention has been made in an effort to provide a memory protection circuit capable of preventing the damage or transformation of memory data even before a liquid crystal module is fabricated.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the invention, examples of which are illustrated in the accompanying drawings. Wherever possible, the same reference numbers will be used throughout the drawings to refer to the same or like parts. Detailed description of known arts will be omitted if it is determined that the parts can mislead the embodiments of the invention.

Figure 1:
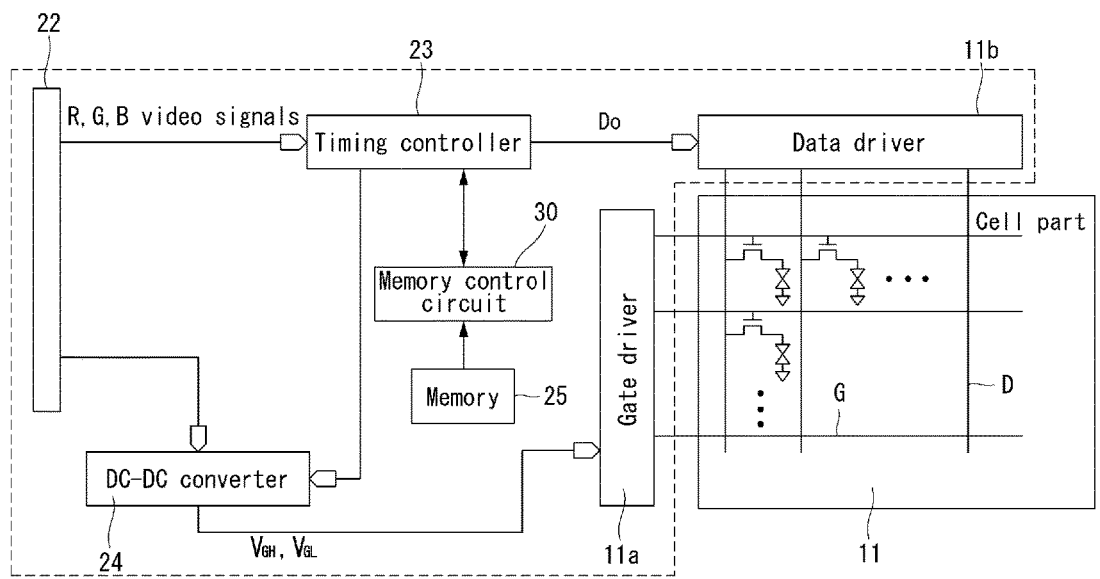
FIG. 1 is a diagram showing a liquid crystal display according to the present invention.

FIG. 1 is a diagram showing a liquid crystal display according to the present invention.

Referring to FIG. 1, a liquid crystal display according to the present invention includes a liquid crystal display panel 11, a gate driver 11a, a data driver 11b, a timing controller 23, a memory 25, and a memory protection circuit 30.

The liquid crystal display panel 11 has a matrix type of pixel regions obtained by arranging a plurality of gate lines G and a plurality of data lines D in directions perpendicular to each other. Each of the pixel regions includes a thin film transistor (TFT) and a liquid crystal capacitor (Clc) connected to the TFT. The liquid crystal capacitor (Clc) consists of a pixel electrode connected to the TFT and a common electrode interposed between the pixel electrode and liquid crystals. The TFT supplies a data voltage to the pixel electrode from each data line D in response to a scan pulse from each gate line G. The liquid crystal capacitor (Clc) charges a difference voltage between the data voltage supplied to the pixel electrode and the reference common voltage supplied to the common electrode, and varies the alignment of liquid crystal molecules according to the difference voltage, thereby controlling the light transmittance. In addition, a storage capacitor (Cst) is connected with the liquid crystal capacitor (Clc) in parallel, so that the voltage charged in the liquid crystal capacitor (Clc) is maintained until a next data signal is supplied.

The timing controller 23 reads data stored in the memory to output an operation signal for operating a DC-DC converter 24 and various control signals for operating the liquid crystal display panel. The timing controller 23 inputs an input/output control clock CLK to the memory 25 to receive driving information of the liquid crystal display panel 11 and image data modulation information, and controls the gate driver 11a and the data driver 11b based on the driving information and the image data modulation information.

The DC-DC converter 24 receives a voltage from a system through a connector 22 to output driving voltages (Vcc and Vdd) and output a gate low-voltage signal VGL and a gate high-voltage signal VGH in response to the operation signal of the timing controller 23.

The gate driver 11a receives the gate high-voltage signal VGH and the gate low-voltage signal VGL from the DC-DC converter 24 by the operation signal of the timing controller 23 to generate the scan pulse, and sequentially supplies the scan pulse to the respective gate lines G of the liquid crystal display panel 11.

The data driver 11b receives a corrected video signal Do, which is a digital signal, from the timing controller 23 to convert it into a corrected data signal, which is an analog signal, and supplies the corrected data signal to the respective data lines D of the liquid crystal display panel 11.

The memory 25 stores the size of the liquid crystal display panel 11, resolution conversion information, image data modulation information, driving frequency and driving timing information of the timing controller 23, etc. In addition, the memory 25 supplies the stored driving information, image data modulation information, and the like, to the timing controller 23 when the input/output control clock is input.

An electrically erasable programmable read only memory (EEPROM) or the like may be used as the memory 25. The EEPROM is a memory device that stores data even though it is turned off, and performs data transmission and receipt with the timing controller 23 through a serial communication unit such as a 12C bus. A 12C bus is a 2-wire serial communication interface, and a data communication method between integrated circuits composed of a serial data line (SDA) and a serial clock line (SCL).

Figure 2:
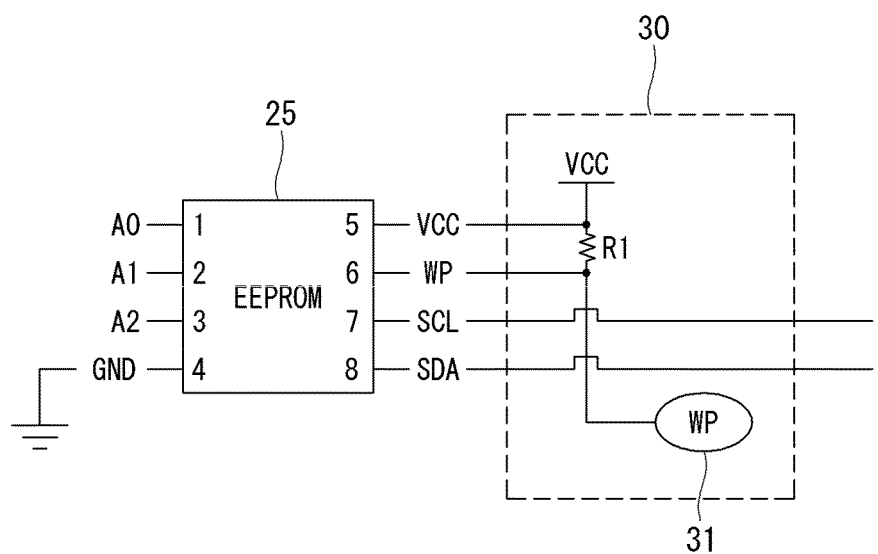
FIG. 2 is a drawing showing a memory and a memory protection circuit according to the present invention.

As illustrated in FIG. 2, the memory 25 includes a plurality of terminals, and the connection relationship between the terminals is described as follows. Herein, an A0 terminal 1, an A1 terminal 2, and an A2 terminal 3 are for setting EEPROM address for 12C communication. A GND terminal 4 is connected to the ground voltage. An SDA terminal 8 and an SCL terminal 7 receive a clock signal CLK and a data signal DATA for 12C communication. A WP terminal 6 is a write protection terminal, and when a high-level voltage is applied, its write protection function is enabled, and thus only a read operation is performed. In addition, when a low-level voltage is applied, the read and write functions are enabled. A VCC terminal 5 is a power source, and receives an input voltage.

The memory protection circuit 30 enhances the write protection function of the memory 25, and includes a pull-up resistor R1 and a pad 31.

One end of the pull-up resistor R1 is connected to the WP terminal 6, and the other end of the pull-up resistor R1 is connected to the power voltage VCC. That is, the pull-up resistor R1 pulls up the voltage of the WP terminal 6 of the memory 25 to the power voltage VCC. Since the WP terminal 6 of the memory 25 is maintained at a high voltage, the write protection function of the memory 25 is continuously enabled.

Figure 3:
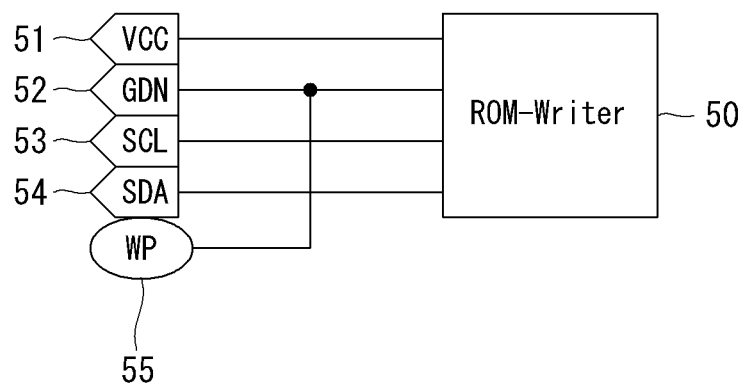
FIG. 3 is a drawing showing an example of a ROM-writer.

The pad 31 is connected to the WP terminal 6, and receives a low voltage through the ROM writer 50 (FIG. 3). That is, the pad 31 supplies the WP terminal 6 with the low voltage received from the ROM writer 50 to disable the write protection function of the memory 25.

As described above, the memory protection circuit 30 of the present invention enables the write protection function of the memory 25 in a general state, thereby preventing the damage of the data of the memory 25. In addition, the memory protection circuit 30 selectively receives a low voltage from the pad 31 to disable the write protection function of the memory 25.

FIG. 3 is a view showing the ROM-writer (50) for disabling the write protection function of the memory 25 and performing the read and write functions.

Referring to FIG. 3, the ROM-writer 50 includes a VCC pin 51, a GND pin 52, an SCL pin 53, an SDA pin 54, and a WP pin 55.

The VCC pin 51 is to provide an operation voltage to the VCC terminal 5 of the memory 25. That is, the ROM-writer 50 operates the memory 25 through the VCC pin 51, so that the 12C communication of the ROM-writer 50 and the memory 25 is possible.

The GND pin 52 is connected to the GND terminal of the memory 25.

The SDA pin 54 and the SCL pin 53 are respectively connected to the SDA terminal 8 and the SCL terminal 7 of the memory 25 to supply the clock signal CLK and the data signal DATA to the memory 25.

The WP pin 55 diverges from the GND pin 52 to supply a low voltage to the WP terminal 6 of the memory 25.

Figure 4:
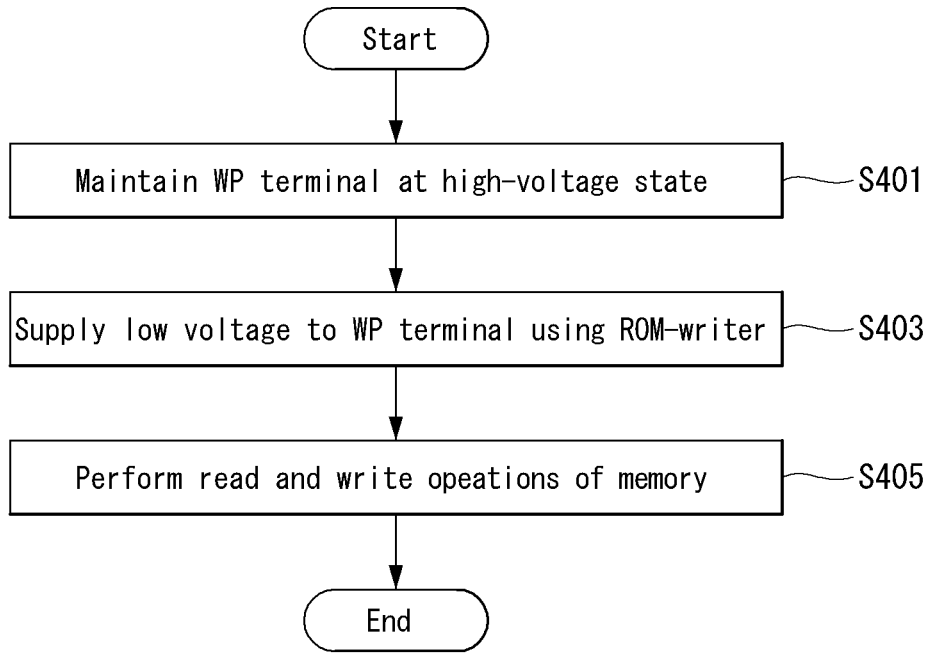
FIG. 4 is a flowchart showing a method for controlling a write protection function of a memory according to the present invention.

A method for operating the read and write functions of the memory 25 using the memory protection circuit 30 and the ROM-writer 50 is described with reference to a flowchart in FIG. 4 as follows.

Maintain WP Terminal at High-Voltage State: S401

The WP terminal 6 of the memory 25 is maintained at a high-voltage state. Since the WP terminal 6 of the memory 25 is connected to the power voltage VCC through the pull-up resistor R1, the WP terminal 6 of the memory 25 is maintained at a state in which the power voltage VCC as a high voltage is applied. Therefore, the memory 25 receives a high voltage through the WP terminal, and thus the write protection function is enabled.

Supply Low Voltage to WP Terminal Using ROM-Writer: S403

In the case where data of the memory 25 are changed, a low voltage is applied to the WP terminal 6 of the memory 25 using the ROM-writer 50. The ROM-writer 50 includes the WP pin 55 in order to supply the low voltage to the WP terminal 6. The WP pin 55 is connected to the GND pin 52. That is, the pad 31 of the memory 25 receives the low voltage through the WP pin 55 of the ROM-writer 50, and thus the write protection function of the memory 25 is not enabled.

Perform Read and Write Operations of Memory: S405

In step S403, the WP terminal 6 receives the low voltage, and at the same time the VCC terminal 5 receives a power voltage through the VCC pin 51 of the ROM-writer 50. Therefore, the circuit of the memory 25 operates, and thus read and write functions thereof are enabled.

As described above, according to the present invention, the write protection function of the memory is always enabled, thereby preventing the damage or transformation of the data of the memory. Further, the present invention can disable the write protection function of the memory and write data to the memory since the pad is connected to the low-voltage terminal of the ROM-writer when the data are written on the memory.

The present invention has been described by exemplifying the liquid crystal display, but the memory protection circuit can be also applied to display devices, such as an organic light emitting display (OLED), plasma display panel (PDP), and an electrophoresis display (EPD).

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A liquid crystal display device, comprising:
a liquid crystal display panel;
a memory for storing driving information and image data modulation information, and supplying the stored driving information and image data modulation information to a timing controller, the memory comprising a power source terminal to receive a power voltage and a write protection terminal;

a memory protection circuit for enhancing a write protection function of the memory, the memory protection circuit consisting of:

a pull-up resistor directly connecting the write protection terminal and the power source terminal, the pull-up resistor having one end connected to the write protection terminal and another end connected to the power source terminal, the pull-up resistor pulling up a voltage of the write protection terminal to the power voltage to enable the write protection function, and a pad directly connected to both a ground terminal and the write protecting terminal and configured to apply a low voltage to the write protection terminal, wherein the pad is connected to a single low-voltage source of a ROM-writer which writes data on the memory so that the ROM-writer is capable of disabling the write protection function of the memory and performing read and write functions, wherein a serial clock line terminal of the memory is directly connected to the ROM-writer to receive a clock signal, with the pull-up resistor of the memory protection circuit being the sole resistor directly connected to the memory and to the pad receiving the single low-voltage source of the ROM-writer; and the timing controller for reading the data stored in the memory to output various control signals, image data modulation information and driving timing information for driving the liquid crystal display panel, wherein the timing controller further reads the data stored in the memory to control operation of a power source.

2. The liquid crystal display device of claim 1, wherein the low-voltage source of the ROM-writer is supplied to the memory through a pin diverging from a ground pin of the ROM-writer.

3. The liquid crystal display device of claim 1, wherein the memory is an electrically erasable programmable read only memory (EEPROM) connected to the timing controller of a display device.

4. The liquid crystal display device of claim 3, wherein the pull-up resistor is connected to the write protection terminal and a VCC terminal of the memory.

5. The liquid crystal display device of claim 1, wherein the memory further stores a size of the liquid crystal panel, resolution conversion information, and driving frequency information.

* * * * *